United States Patent [19]
van Mellaert et al.

[11] 4,174,262
[45] Nov. 13, 1979

[54] DEVICE FOR FASTENING AT LEAST ONE PLATE INSIDE AN ELECTROLYTE BATH AND FOR FEEDING CURRENT THERETO

[76] Inventors: Jozef K. E. H. van Mellaert; Luc J. P. van Mellaert, both of Paalseweg, 51a, Tessenderlo, Belgium

[21] Appl. No.: 909,004
[22] Filed: May 24, 1978
[51] Int. Cl.² .............................................. C25D 17/08
[52] U.S. Cl. .................. 204/297 R; 204/291; 204/297 W; 204/DIG. 7
[58] Field of Search .............. 204/297 R, 297 W, 291, 204/DIG. 7, 198

[56] References Cited
U.S. PATENT DOCUMENTS
3,983,024  9/1976  Boggio .................................. 204/198

Primary Examiner—F. C. Edmundson
Attorney, Agent, or Firm—Thomas E. Beall, Jr.

[57] ABSTRACT

A device for fastening at least one plate inside an electrolyte bath and for feeding current thereto, which device comprises at least two electrically-insulated battens which run next to one another and between which the plate should be arranged with the flat sides thereof facing the battens, at least one of said battens comprising an imbedded electrical conductor which can be connected to the current source, and the device further comprises means to push the battens towards one another, said means being completely electrically insulated from the conductor while the means for insuring the electrical contact between the conductor and the plate are comprised of projections extending from that side facing the other batten of the first-mentioned batten with the electrical conductor, said projections contacting the conductor and passing cross-wise through said batten insulation, said projections engaging the plate when clamping said plate between both battens.

15 Claims, 3 Drawing Figures

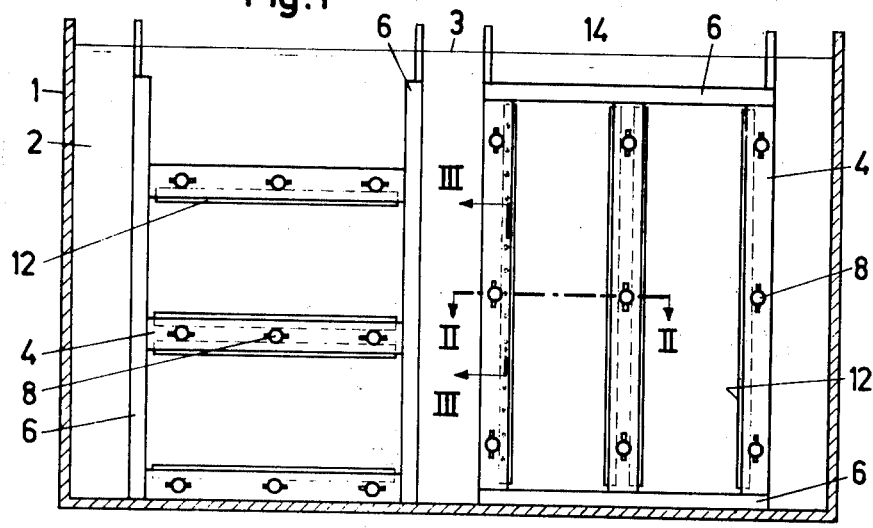
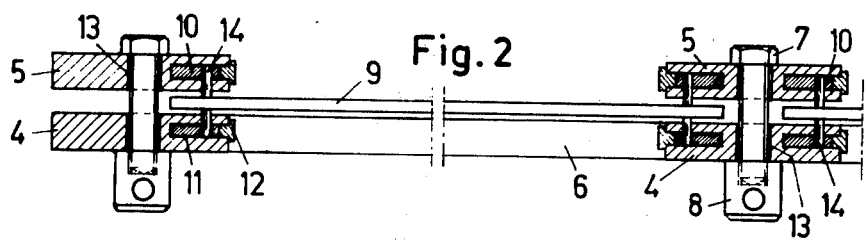
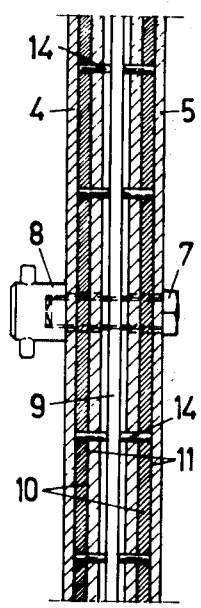

DEVICE FOR FASTENING AT LEAST ONE PLATE INSIDE AN ELECTROLYTE BATH AND FOR FEEDING CURRENT THERETO

BACKGROUND OF THE INVENTION

The invention relates to a device for fastening at least one plate inside an electrolyte bath and for feeding current thereto, which device comprises at least one electrically-insulated batten wherein at least one electric conductor is imbedded, which conductor can be connected to a current source, and means to insure the electric contact between the conductor and the plate.

Such devices are notably used for manufacturing so-called printed circuits. A plate from electrically-insulating material having already some metal plating, is arranged thereby inside an electrolyte bath and by feeding current to said plating, metal is caused to precipitate over the complete plating or according to a determined pattern by covering partly said plating.

In known devices of this kind, one or a plurality of such battens with an imbedded conductor are so fastened substantially vertically to a cathode bus bar that said battens are immersed into the electrolyte bath. Inside the bath proper, to said batten are fastened clamps which are also electrically insulated by means of a synthetic material coating, but not in those locations where said clamps are to contact the plate. The conducting core of said clamps is connected to the batten conductor. The clamps proper are tightened down on a plate by means of screws. Due to said screws and wear, the clamp insulation is quite rapidly damaged. As soon as the insulation is removed, there also occurs a plating of the clamps proper which thus means a loss of material.

When removing the metal plating from the clamps, there is again a danger that the clamps will be further damaged, whereby during the following use still more clamp plating will occur.

With other devices, the clamps are formed by springs which engage the batten conductor by means of a bolt. The above-described drawbacks are also to be found in these latter devices.

In still further devices, the clamps have no screw but the device comprises two battens which are immersed vertically in the bath, and which are provided on the sides thereof facing one another with contact springs with a groove, the plate being clamped with the upstanding edges thereof between said springs. Not only there is still obtained some precipitating on the springs but also due to the contact springs engaging two facing edges of the plate, with other plate sizes said springs and thus also the battens with the conductor have to be moved.

Now to solve the problems of metal plating on the clamps, it has already been proposed not to immerse the clamps in the electrolyte bath but to retain same above said electrolyte bath. With this solution, there is thus no problem with metal plating of the clamps, but part of the plates has to project above the electrolyte bath and thus is not used purposefully.

SUMMARY

The invention has now for object to obviate all of the above drawbacks and to proide a device for the fastening of at least one plate inside an electrolyte bath and the feeding of current thereto whereby the plate can still be completely immersed in the electrolyte bath but whereby not only the plate fastening can occur very fast but also the precipitating of metal on the device is substantially avoided and the damaging of said device by the cleaning or the plate fastening is substantially excluded.

For this purpose the device comprises at least two electrically-insulated battens which run next to one another and between which the plate should be arranged with the flat sides thereof facing the battens, at least one of said battens comprising an imbedded electric conductor which can be connected to the current source, and the device further comprises means to push the battens towards one another, said means being completely electrically insulated from the conductor while the means for insuring the electric contact between the conductor and the plate are comprised of projections standing on that side facing the other batten of the first-mentioned batten with the electric conductor, said projections contacting the conductor and passing crosswise through said batten insulation, said projections engaging the plate when clamping said plate between both battens.

In a particular embodiment of the invention, the batten provided with at least one conductor is comprised of a batten from insulating material wherein at least one conductor is imbedded and the insulating material of which has by itself a strong enough mechanical strength to clamp a plate together with the other batten.

In a peculiar embodiment of the invention, the means for pushing the battens together are comprised of bolts and nuts.

In an advantageous embodiment of the invention, both battens are provided with at least one conductor.

In an useful embodiment of the invention, that batten provided with at least one conductor has two conductors running along the lengthwise direction thereof, in such a way that when the battens are pushed together, the edges of at least two plates lying on either sides of said batten can be clamped between both battens.

BRIEF DESCRIPTION OF THE DRAWING

Other details and features of the invention will stand out from the following description given by way of non limitative example and with reference to the accompanying drawings, in which:

FIG. 1 is a cross-section through an electroyte bath wherein are mounted two devices according to the invention.

FIG. 2 is a cross-section along line II—II in FIG. 1, drawn on a larger scale, with plates shown clamped in the device.

FIG. 3 is a cross-section along line III—III in FIG. 1, drawn on the same scale as FIG. 2 and also with plates clamped in the device.

In the various figures the same reference numerals pertain to similar elements.

Both devices for fastening a plate and feeding current thereto as shown in the figures, are mounted inside a bath 1 filled with electrolyte 2. The electrolyt level is shown in 3. The devices are completely immersed in the electrolyt 2.

Each one of said device comprises three pairs of cooperating clamping battens 4 and 5. The clamping battens 4 and 5 in each pair are identical. The battens 4 in the three pairs are further connected at the ends thereof by connecting battens 6 to form a framework. The clamping battens 4 and consequently also the clamping battens 5 run thereby in parallel relationship to one another and at right angle to the connecting battens 6. A framework thus formed by battens 4, 5 and 6 can be arranged in bath 1 both with the clamping battens 4 and 5 thereof vertical and with the battens 4 and 5 horizontal. In the framework shown at the left in figure 1, the battens 4 and 5 lie horizontally while in the framework shown on the right in figure 1, the battens 4 and 5 run vertically.

The battens 4 and 5 in each pair are joined together by means of bolts 7 and nuts 8 screwed thereon. With these bolts 7 and nuts 8 the battens 4 and 5 in each pair can also be pushed together in such a way that a plate 9 to be coated electrolytically can be clamped therebetween.

The connecting battens 6 are entirely made from plastics. The battens 4 and 5 in each pair are also made mainly from plastics but they have one or several metal conductors 10 imbedded therein. The plastic material of the battens 4 and 5 does not comprise a simple coating of the conductors as without said conductors 10, the battens 4 and 5 would have enough strength in themselves to clamp the plate 9.

The battens 4 and 5 in both outermost pairs in each framework 4, 5, 6 have but one conductor 10. Said conductor 10 is formed by a bar which extends substantially over the whole length of the batten 4 or 5 but which has however a width and thickness which is smaller than the width and thickness of the batten 4 or 5 proper. Said conductor 10 lies closer to that edge facing the middle pair of battens 4 and 5, of the batten 4 or 5 than to the other edge. The conductor 10 enters actually completely inside a groove 11 which opens on said edge. The width of conductor 10 is smaller than the groove depth. The conductor 10 lies as far down as possible in groove 11 and the remaining portion of said groove is sealed with a strip 12 from plastic electrically-insulating material. The various bolts 7 go through openings 13 in battens 4 and 5 in said outermost pairs, said openings 13 lying completely next to the conductors 10. Said bolts 7 can be made from metal as they do not contact any conductor 10. The conductors 10 in both battens 4 and 5 in each outermost pair are further connected to a current source by means of a conductor also provided with an insulation, which is not shown in the drawings for clearness sake.

A number of small metal pins 14 further stand on each one of the battens 4 and 5 in each one of said latter outermost pairs of battens. Said pins 14 engage the conductor 10 of the corresponding batten, for instance by being clamped in the conductor, projecting through the plastics surrounding said conductor and projecting somewhat out of the batten, on that side facing the other batten in the pair. The pins 14 on both battens 4 and 5 in a pair lie exactly opposite one another.

The battens 4 and 5 in the middle pair of each framework 4, 5, 6 each comprise two conductors 10. Said conductors 10 are imbedded in the same way as for the above-described battens 4 and 5 inside a groove 11 in said battens and they have identical shapes. A batten 4, 5 of the middle pair thus encloses adjacent each one of the lengthwise edges thereof, a batten-shaped conductor 10 which is completely imbedded in the batten and completely insulated. Both conductors 10 of a batten 4 or 5 in the middle pair are connected either singly or jointly to a current source, by means of a completely electrically-insulated conductor which has not been shown in the figures for clearness sake. The bolts 7 go through openings 13 in the battens 4 and 5 of said middle pair, said openings 13 lying precisely between both conductors 10 in each batten 4 and 5. Said battens 4 and 5 are also provided with small pins 14 on those sides thereof facing one another. A series of pins 14 is connected to each conductor 10 and they project slightly out of the plastics from the batten. Opposite each pin 14 standing on batten 4 also lies a small pin 14 standing on batten 5.

Between the middle pair and each one of the outermost pairs of battens can be clamped a number of plates 9 to be treated electrolytically. The number of plates is dependent on the length of battens 4 and 5 and on the plate size. In FIGS. 2 and 3 but two plates 9 have been shown, namely one plate between the middle pair of battens 4, 5 and each outermost pair of battens 4, 5 respectively. Each one of said plates thus lies clamped with the one edge thereof between both battens 4,5 in an outermost pair, and with the opposite edge thereof clamped between the nearest portion of the middle pair of battens 4,5. Care is taken to avoid said plates 9 contacting bolts 7. When the nuts 8 are tightened on said bolts 7, the battens 4 and 5 are pushed together whereby thus one edge of plate 9 is clamped between same and more precisely between the small pins 14 thereof. The plate 9 is thus not only retained in a fast and reliable way, but also the plate 9 lies with each flat side thereof against the pins 14 to be connected therethrough to the conductor 10 they connect with. As both battens 4 and 5 of each pair are connected separately to the current source, both flat sides of plate 9 are also fed current separately. By regulating the current it is thus possible to plate the one side of plate 9 faster than the other side or consequently for a determined dwell time of the plate inside the bath, to obtain a thicker electrolytic layer on the one side of plate 9 relative to the other side. The current distribution is perfect in such a way that the electrolytic layer on each plate side is quite homogeneous. To the exception of the slightly protruding ends of the small pins 14, no live metal parts of the device lie in contact with the electrolyte which excludes precipitating thereon. A possible plating of the pins 14 can easily be removed. During such removing there is but a slight danger of damaging the battens 4 and 5 and even if some damage were to occur, there is still but slight danger that the conductor 10 in said battends will be exposed thereby. The device does not comprise clamps the insulation of which can wear down. The battens are pushed together by bolts which as they do not contact the plates nor any other live part, can even be made from metal without any danger of metal precipitating thereon from the electrolyte bath.

The above-described devices are particularly suitable for those cases where a plate 9 should not only be retained inside the elecrolyte bath 1 but also fed with current. It is of course clear that the same devices can also be used when no current is to be fed to the plate, in such a way that with a cycle in which for instance insulating plates should first be plated chemically with metal, thus without being fed current, and in a further step should be plated with current being fed thereto, the same devices can be used for both operation steps.

It must be understood that the invention is in no way limited to the above embodiments and that many changes can be brought therein without departing from the scope of the invention as defined by the appended claims.

Particularly the device does not have to comprise a plurality of cooperating batten pairs which are joined into a framework. The device can be comprised only of a pair of such battens.

Both battens in each pair do not have either to be necessarily provided each with a conductor. When for instance the plate should be plated electrolytically but on one side thereof, it is sufficient to provide a conductor in the batten on that side. By "feeding current to the plate" there should always be understood the feeding of current to the metal plating when the plate is formed by an insulating sheet and a conducting plating thereof.

The means for pushing the plates together should not necessarily be comprised of bolts and nuts. The way in which said battens are pushed together is not critical, as there is no problem of any metal precipitating on said means which do not contact anyway any live part.

In that case where the fastening device comprises a plurality of batten pairs as described above, it is not required that each batten in the not outermostlying pairs comprises two conductors. Such battens can for example comprise but one conductor to which connect two series of pins.

The pins which stand on the battens in one and the same pair should not necessarily be directly facing one another. Said pins may for example be staggered.

The projections provided on the battens should not however absolutely be pins. They could also be comprised of small elongated ribs.

The connecting battens of the frameworks should not necessarily be made entirely from synthetic material. They could also comprise an imbedded conductor which connects directly to the conductors of the battens connected thereto, said latter conductors might be connected through the connecting batten conductor and possibly an insulated conductor joined thereto, to the current source.

While a preferred embodiment of the present invention has been described in detail not only for purposes of illustrating and the advantages of the details thereof, with mentioned variations, further embodiments modifications and variations are contemplated according to the broader aspects of the present invention, all as determined by the spirit and scope of the following claims.

We claim:

1. A device for fastening at least one plate inside an electrolyte bath and for feeding current thereto, for depositing a coating on the plate, comprising:
   at least two parallel electrically insulated battens;
   at least one electrical conductor embedded in one of said battens, and having means for connecting it to an electric current source;
   electrically conductive contact means for providing electrical connection between said conductor and the plate, comprising a plurality of electrically conductive projections extending from said conductor, through the electrically insulated batten transversely of the batten, and outwardly from said one batten toward the other of said battens for engaging a plate placed between said battens; and
   fastener means electrically insulated from said conductor for clamping the plate between said battens and establishing electrical contact between said projections and the plate.

2. The device as defined in claim 1, wherein said one batten has sufficient mechanical strength without the reinforcement of said conductor to provide the clamping force together with said fastening means sufficiently for holding the plate securely.

3. The device as defined in claim 1, wherein said one batten is provided with an outwardly opening groove extending along its length and completely receiving therein said conductor, with the conductor filling only the interior portion of said groove, and an electrically insulated sealing strip secured within the exterior portion of said groove to effectively close said groove and embed the conductor within said one batten.

4. The device of claim 3, wherein each of said groove, conductor, and sealing strip extend for substantially the full length of said one batten and parallel to the other of said battens, and further wherein said groove opens outwardly in a direction generally perpendicular to said projections and generally parallel to the extent of the plate when clamped between said battens.

5. The device of claim 1, wherein said fastening means comprises a plurality of nuts and bolts spaced from each other along the length of said batten.

6. The device as defined in claim 16, wherein each of said bolts extends entirely through both of said battens with batten electrically insulated material separating said bolts from said conductor.

7. The device as defined in claim 6, wherein said bolts extend parallel to said projections, are spaced from each other along the length of said batten, and extend generally perpendicular to the plate when it is clamped between the battens.

8. The device as defined in claim 1, further including a second electrical conductor embedded within said other batten; further contact means substantially identical to said first mentioned contact means with projections extending from and in electrical contact with said second conductor through said other batten towards the one batten, so that the projections of each conductor will form electrical secure contact with the opposite faces, respectively, of the plate when the plate is clamped between the battens.

9. The device as defined in claim 8, wherein each projection of the conductor of said one batten is aligned with and extends towards a corresponding projection of the conductor of the other batten, when said fastening means clamp the plate therebetween.

10. The device as defined in claim 8, further including a second electrically conductive conductor embedded within said one batten in parallel spaced relationship with respect to said first mentioned conductor, with electrically insulated material of said one batten between said conductors; and further contact means for providing electrical connection between the second conductor and a second plate to be clamped between the battens in spaced relationship with respect to the first plate, comprising additional projections extending from the second conductor, through the electrically insulating material of said one batten and from said one batten towards the other of said battens.

11. The device as defined in claim 10, wherein said fastening means includes a plurality of bolts extending through said battens equal distance between and spaced from said conductors, with electrically insulating material of said battens between said bolts and said conductors.

12. The device as defined in claim 1, wherein said projections are a plurality of generally parallel pins.

13. The device as defined in claim 1, including at least a second pair of battens respectively identical to said first mentioned battens; an additional conductor embedded within one batten of said second pair of battens; additional contact means providing electrical connection between said additional conductor and the plate, and comprising a plurality of projections being in electrical contact with said additional conductor, extending from said additional conductor, extending through said one batten of said second pair of battens, and projecting outwardly from said one batten of said second pair of battens towards the other batten of said second pair of battens; and additional fastener means for engaging the battens of said second pair of battens and clamping therebetween the plate.

14. The device as defined in claim 13, including means rigidly interconnecting all of said battens.

15. The device as defined in claim 14, wherein said means for rigidly interconnecting forms a frame with all of said battens independently of said plate.

* * * * *